United States Patent [19]
Narisawa et al.

[11] Patent Number: 6,070,730
[45] Date of Patent: Jun. 6, 2000

[54] DISK CONTAINER

[75] Inventors: Motoyuki Narisawa, Ichihara; Kazuo Kaneko, Yonezawa, both of Japan; Timothy D. Schmidt; Dale A. Maenke, both of Chaska, Minn.; Michael C. Zabka, Barron, Wis.

[73] Assignee: Fluoroware, Inc., Chaska, Minn.

[21] Appl. No.: 08/877,733

[22] Filed: Jun. 18, 1997

[51] Int. Cl.⁷ ................................................ B65D 85/48
[52] U.S. Cl. ........................ 206/711; 206/454; 220/784
[58] Field of Search ............................ 206/710, 711, 206/722, 723, 445, 454, 832; 220/784

[56] References Cited

U.S. PATENT DOCUMENTS

| | | |
|---|---|---|
| Re. 33,361 | 10/1990 | Coe . |
| 4,160,504 | 7/1979 | Kudlich et al. . |
| 4,557,382 | 12/1985 | Johnson . |
| 4,588,086 | 5/1986 | Coe . |
| 4,718,549 | 1/1988 | Rissotti et al. . |
| 4,718,552 | 1/1988 | Rossi et al. ............................ 206/711 |
| 4,721,207 | 1/1988 | Kikuchi . |
| 4,747,488 | 5/1988 | Kikuchi . |
| 4,880,116 | 11/1989 | Kos . |
| 5,253,755 | 10/1993 | Maenke . |
| 5,390,811 | 2/1995 | Ogino et al. ............................ 206/711 |
| 5,833,067 | 11/1998 | Joshi ........................................ 206/711 |

Primary Examiner—Paul T. Sewell
Assistant Examiner—Luan K. Bui
Attorney, Agent, or Firm—Palmatier, Sjoquist, Voigt & Christensen, P.A.

[57] ABSTRACT

A container for disks has an improved latching mechanism. The container comprises a cassette with sidewalls with slots for holding disks in an axial arrangement, two opposite endwalls each have a U-shaped recess extending downwardly from the open top, a top cover with a rectangular top portion and two end portions extend downwardly to cover the U-shaped recess. The top cover latches to the cassette by way of a latching mechanism which includes a living hinge, an extension portion, and a hook portion all on each end portion. The hook portion cooperates and engages with a cooperative catch member on the cassette. The extension member is under tension to secure the top cover in place. In an alternate embodiment, recesses on the extension portion connect to nubs on the cassettes or on the bottom cover to secure the top cover in place.

21 Claims, 6 Drawing Sheets

FIG. 1
PRIOR ART
FIG. 2
PRIOR ART
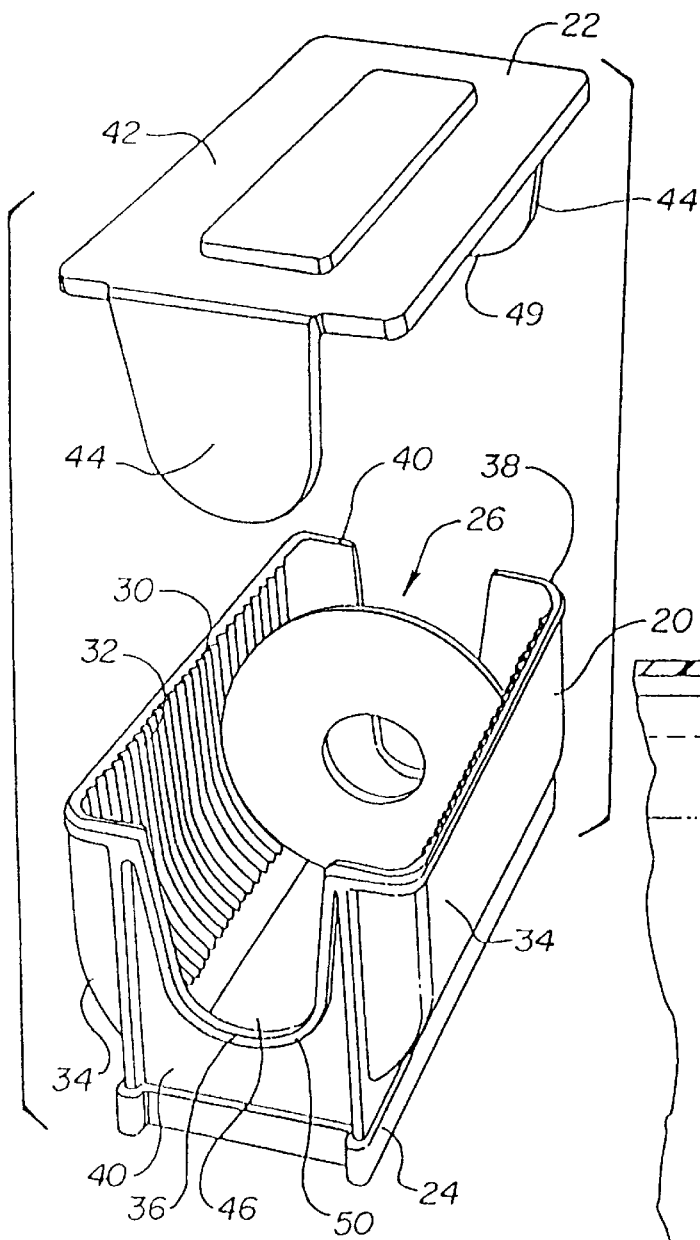
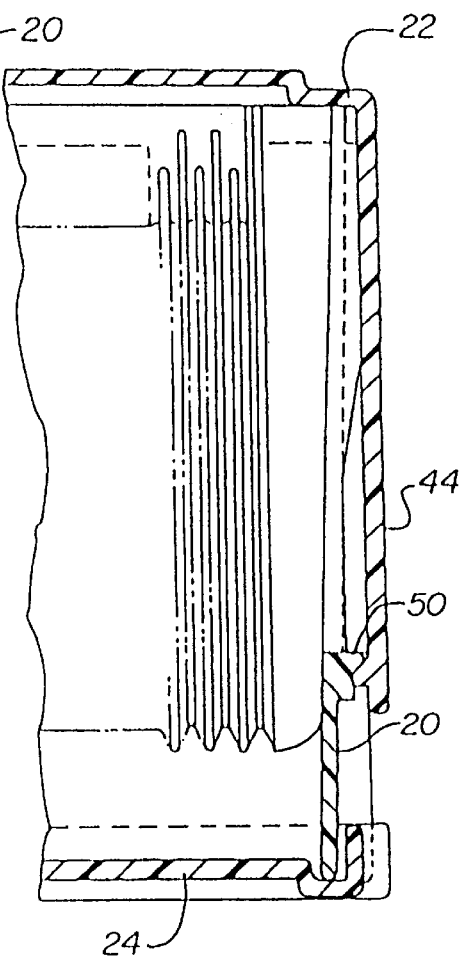

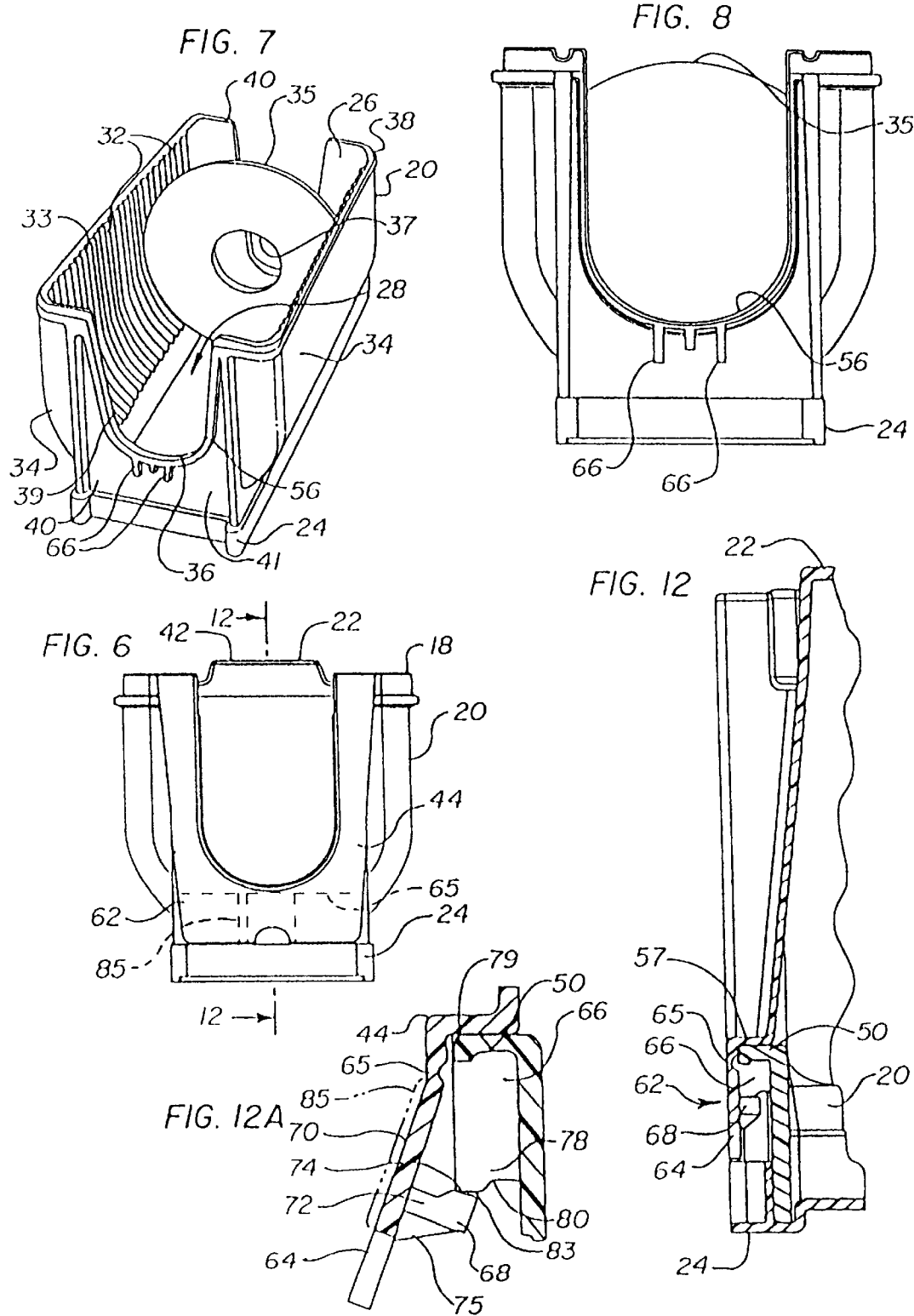

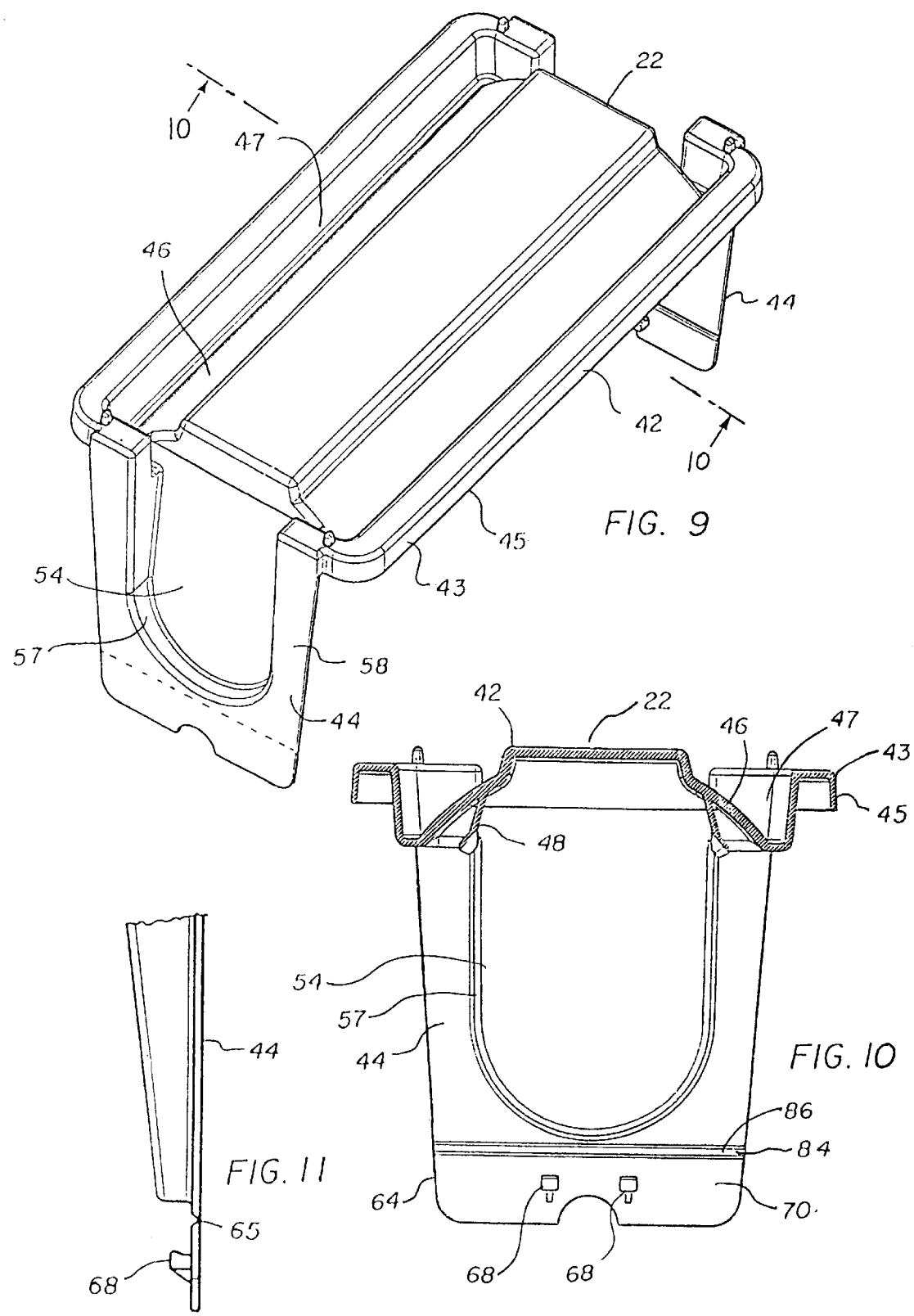

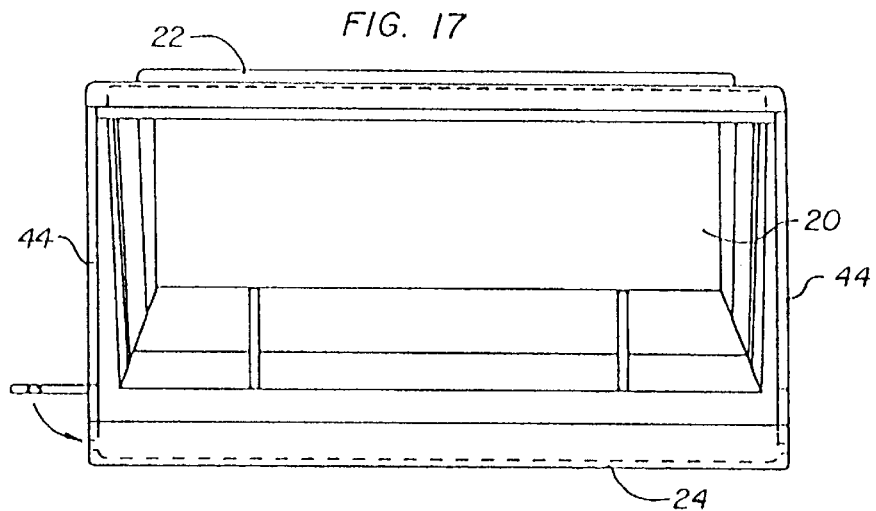
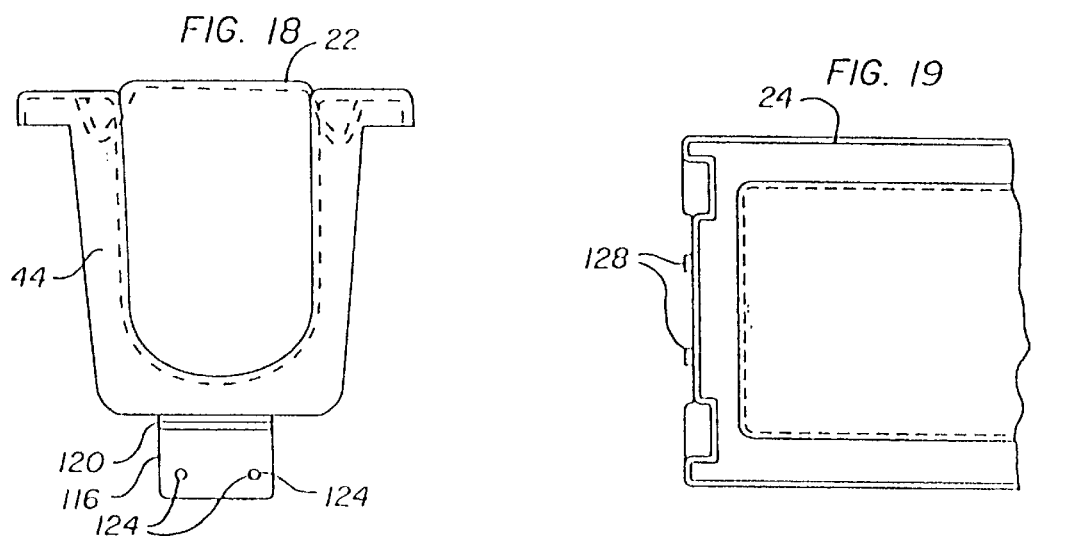
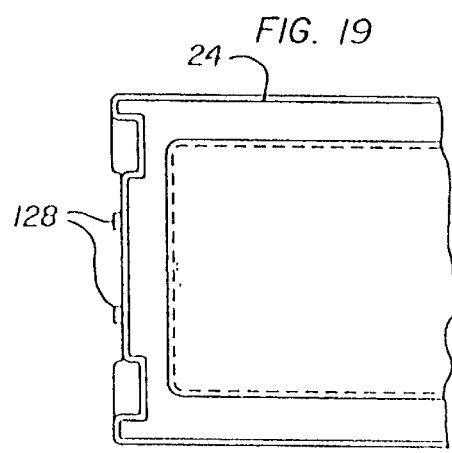
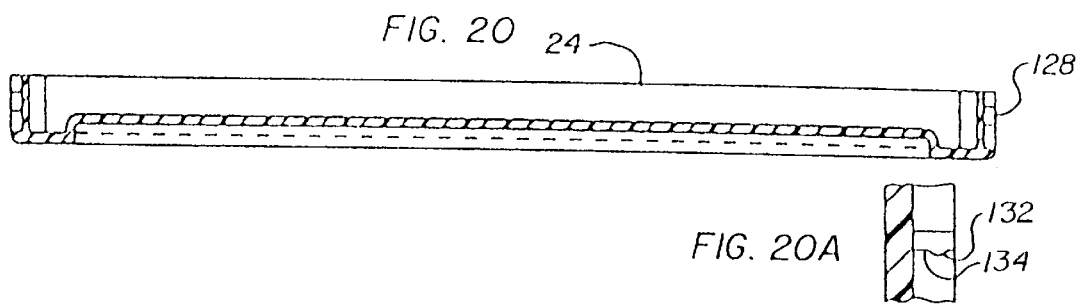
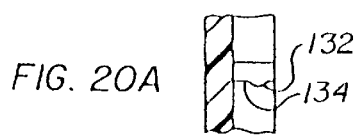

DISK CONTAINER

BACKGROUND OF THE INVENTION

This invention relates to containers for storing and transporting disks. More particularly it relates to such a container with a low particle generating latching mechanism.

Wafers and disks are utilized in the semiconductor industry for processing into circuit chips and magnetic storage disks. The wafers are typically made of silicon or other materials and are subjected to many processing steps before they become integrated circuits. Similarly magnetic storage disks may be made of metal and are also subjected to a number of processing steps. Such magnetic storage disks or wafers must be transported from place of manufacturer to processing facilities and must be transported within such processing facilities. The silicon wafers are particularly fragile and there is always the concern for breakage and/or other damage. The wafers and disks are typically transported in plastic containers adapted for providing a generally sealed enclosure along with providing secure retention and cushioning means for the wafers. It is critical for both wafers and magnetic disks that the enclosure be very clean and preclude entry of particles or other containments. Any particles or other containments in the containers can adhere to the disks or wafers causing damage or necessitating additional cleaning steps.

Containers for magnetic storage disks have become generally standardized their general configuration as shown in Prior Art FIGS. 1, 2, 3, 4, and 5. Such storage disk containers have three principal parts, a cassette 20, a top cover 22 and a bottom cover 24. These component parts are generally molded from thermoplastic materials such as polycarbonate, polypropylene and the like.

The cassette is generally boxed shaped with an open top 26, an open bottom 28, a plurality of slots 30 to in the side walls 34 for holding the disks in an axial arrangement. U-shaped recesses 36 extend downwardly from the top edge 38 into the endwalls 40 allow axial access to the disk apertures.

The top covers generally have rectangular top portion 42 and two end portions 44 which extend downwardly from the top portion. The end portions close the openings 46 in the endwalls. Different means have been utilized to latch the top cover 22 to the cassette 20. One such latching means is shown in the Prior Art FIGS. 1 and 2 and is disclosed in U.S. Pat. No. 4,557,382 to Douglas Johnson. This embodiment utilizes end portions that extend slightly inward to create an interference fit with the cassette. The end portions must be flexed outwardly for the top cover to be lowered and placed on the cassette. The end covers are then held in placed by the spring action of the end portions and also by a frictional engagement. One disadvantage of the top cover latching mechanism of FIGS. 1 and 2 is that the inwardly extending ends can creep outwardly over time such that no spring action is provided for the latching. Additionally, some level of finesse is required to lower the top cover onto the cassette without making scrapping contact between the end portions 44 and with any disks in the cassette or with the rims 50 of the endwalls. Additionally, there have been concerns that the end portion 44 engagement by the lip 49 with the rim 50 does not create a secure latch or an adequate seal particularly around the entire length of said rim 50.

Referring to Prior Art FIGS. 3, 4, and 5 an embodiment is shown which is representative of the invention of the U.S. Pat. No. 5,253,755 to Dale A. Maenke. In this disk container the top cover 22 has a structural offset portion 54 which is shaped to follow the curvature 56 of the U-shaped recess 36 and rim 50. This structural offset thus forms a labyrinthine seal with respect to the path 55 between the end portions 44 of the top cover 22 and the endwalls 40. In the disk container 18 shown in FIGS. 3, 4, and 5 the top cover is lowered down to the cassette such as with one hand and snaps into the engagement position as shown in FIG. 5. The ramped surface 58 engages the rim 50 as it is being lowered down and continued downward pressure on the top portion of the top cover urges the engagement member 60 outwardly to clear the rim to the latched position as shown in FIG. 5. Although this particular latching arrangement and top cover configuration has generally been accepted by the industry, concerns have been raised that such a snap-in top cover operates to launch particles from the top cover and cassette during the snap action. Said particles would thus be airborne to and may end up as containments on the magnetic disks. Therefore it is desirable to have a latching mechanism that is not subject to the creep and sealing problems associated with the embodiment in FIGS. 1 and 2 and that also does not utilize the snap action of the embodiments of FIGS. 3, 4, and 5.

SUMMARY OF THE INVENTION

A container for disks has an improved latching mechanism. The container comprises a cassette with sidewalls having slots for holding disks in an axial arrangement, two opposite endwalls each have a U-shaped recess extending downwardly from the open top, a top cover with a rectangular top portion and two end portions extend downwardly to cover the U-shaped recess. A structural offset extends into the U-shaped recess. The top cover latches to the cassette by way of a latching mechanism which includes a living hinge, an extension portion, and a hook portion on each end portion. The hook portion cooperates and engages with a cooperative catch member on the cassette. The extension member is under tension and secures the top cover in place. In an alternate embodiment, recesses on the extension portion connect to nubs on the cassettes or on the bottom cover to secure the top cover in place.

An advantage and feature of the invention is that the top cover is latched to the cassette without a snap action that can generate and launch particles. Moreover, the top cover can be more easily unlatched than snap-on top covers or other conventional covers.

An advantage and feature of the invention is that the latching mechanism cooperates with and takes advantage of the labyrinthine seal arrangement currently used in such containers.

An advantage and feature of a variation where the extension member extends from the top cover to the bottom cover is that the latching mechanism also secures the bottom cover to the cassette.

An additional advantage of the invention is that the portion of the end portions of the top cover which is principally stressed is below the closing and sealing portions of said top cover end portions.

An additional advantage and feature of the top cover is that it can be readily seen when the top cover is fully latched in that the extension portion is vertical and flush with the rest of the top cover end portion.

BRIEF DESCRIPTION OF THE DRAWINGS

FIG. 1 is a perspective view of a prior art disk shipper container.

FIG. 2 is a cross-sectional view of the latching mechanism of the prior art carrier of FIG. 1

FIG. 6 is an elevational view of a carrier embodying the invention.

FIG. 7 is a perspective view of a cassette and bottom cover of a the carrier of FIG. 6.

FIG. 8 is an elevational view of the carrier of FIG. 6.

FIG. 9 is a perspective view of the top cover of the carrier of FIG. 6.

FIG. 10 is a cross-sectional view of the end portion of the top cover of FIG. 9.

FIG. 11 is an elevational view of the end portion of the top cover of FIG. 9.

FIG. 12 is a cross-sectional view of the latching mechanism of the carrier of FIG. 6 taken at line 12—12 of FIG. 6.

FIG. 12A is a detailed cross-sectional view showing the engagement portions of the latching mechanism of the carrier of FIG. 6.

FIG. 17 is an elevational view of an alternate embodiment of the carrier embodying the invention.

FIG. 18 is an elevational end view of an end portion of the top cover of the carrier of FIG. 17.

FIG. 19 is a plan view of the bottom cover of the carrier of FIG. 17.

FIG. 20 is a cross-sectional view of the bottom cover of the carrier shown in FIG. 17.

FIG. 20A is a detailed cross-sectional view of a portion of the bottom cover shown in FIG. 20.

DETAILED SPECIFICATION

Figure 3:
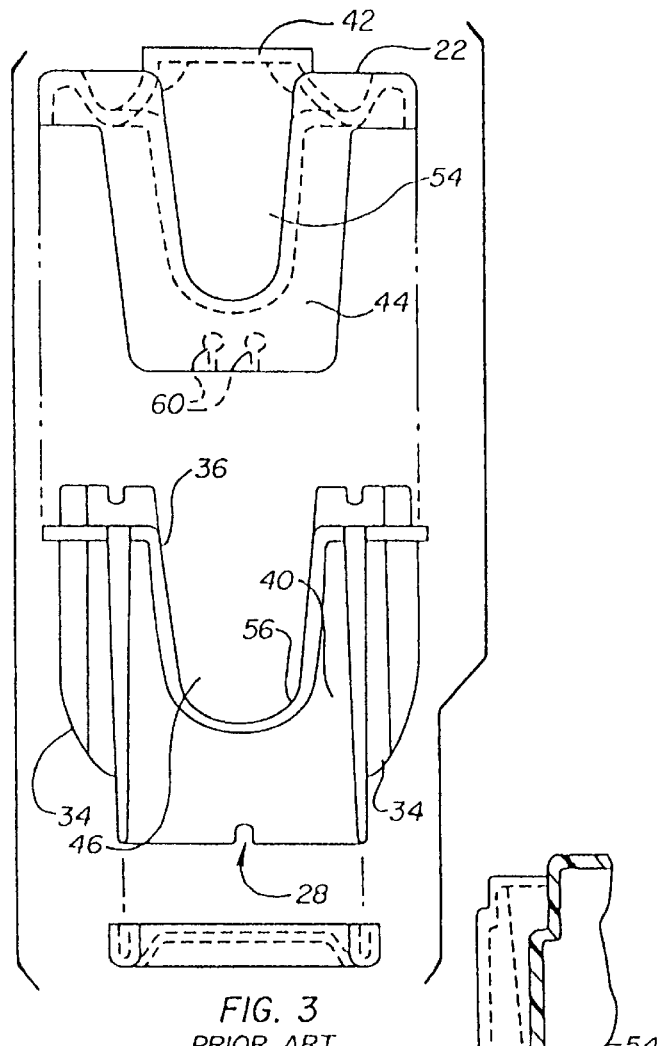
FIG. 3 is an elevational view of the component parts of a prior art disk container.

Referring first to FIGS. 6, 7, 8, 9, 10, 11, 12, and 12A a first variation of the invention is shown in the context of a magnetic disk shipping container generally designated with the numeral 18. When used alone herein "disk" should be considered generic and include both magnetic memory disks, wafers for manufacture into semiconductors and the like.

The container 18 is comprised principally of a cassette 20, a top cover 22, and a bottom cover 24. The cassettes has an open top 26, open bottom 28, slots 32 formed by inwardly extending teeth 33 on the side walls 34 of the cassette. The slots 32 are configured to hold the disks 35 by engaging the edge portions of said disks. This particular disk as shown depicts a magnetic memory disk 35 and has a central aperture 37. The cassette 20 has endwalls 40, a top edge 38 and U-shaped recesses 36 extending downwardly in the endwalls from the top edge. When used herein "U-shaped" does not necessarily indicate the curved recess as shown in 36 but also could be a recess with squared off lower interior corners. Additionally, the upright edges 39 defining the recess may or may not be vertical.

Referring specifically to FIGS. 9, 10, and 11, detailed views of the top cover 22 of the container 18 are shown. The top cover has a generally rectangular top portion 42 with integral downwardly extending end portions 44. The top portion perimeter 43 which includes a downwardly extending lip 45, offset structures 46 defining longitudinally extending recesses 47 which provide rigidity and strength to the top cover. Disk cushions 48 configured as downwardly extending teeth are shown to be integral with the offset structures. Said cushions engage the disk to secure them in place to prevent rotation, rattling, and provide some shock absorption when the top cover is in place.

Figure 4:
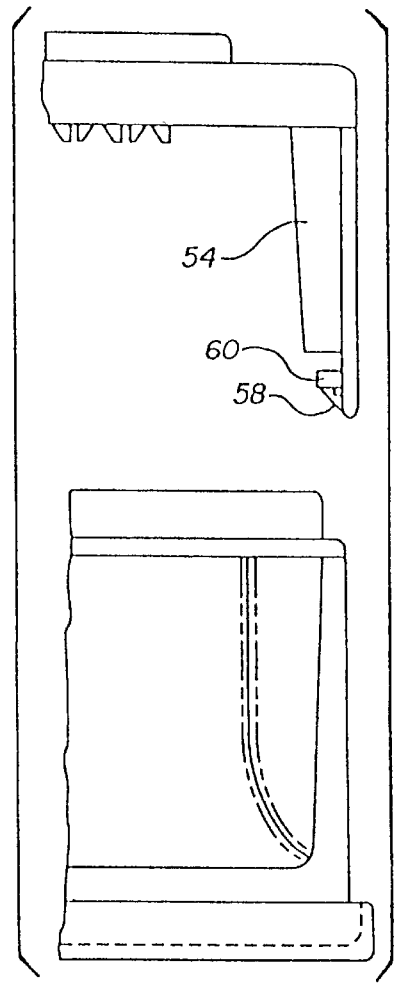
FIG. 4 is an elevational view of a portion of a prior art disk container of FIG. 3.
Figure 5:
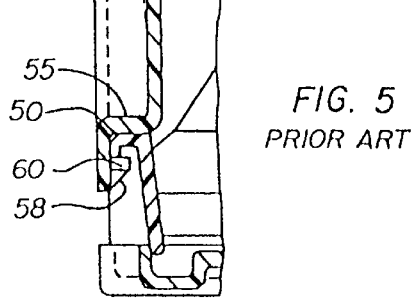
FIG. 5 is a cross-sectional view of the latching mechanism of the prior art carrier of FIGS. 3 and 4.
Figure 13:
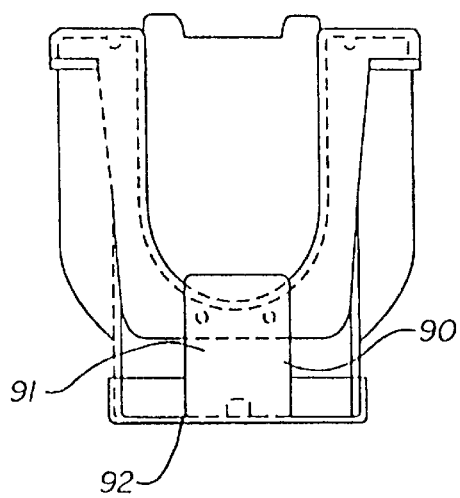
FIG. 13 is an elevational view of an alternate embodiment of the carrier embodying the invention.
Figure 15:
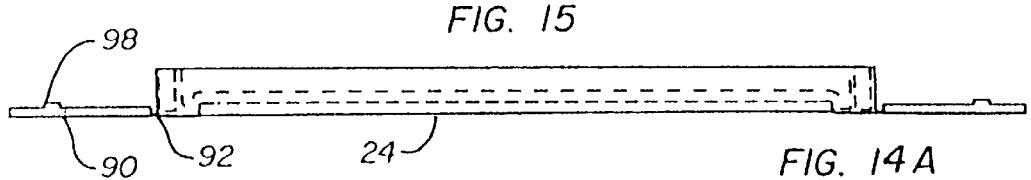
FIG. 15 is an elevational view of the bottom cover of the carrier of FIG. 13.
Figure 16:
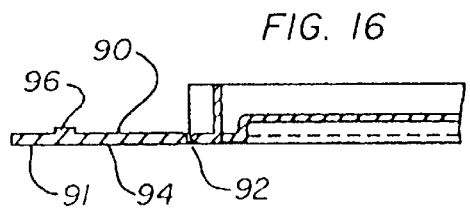
FIG. 16 is a cross-sectional view of the bottom cover shown in FIG. 15.

The end portions 44 of the top cover each have a structural offset 54 which includes a U-shaped flange portion 57 which is configured to follow the curvature 56 of the cassette 20. The downwardly extending lip 43 of the top cover connects with the end portions 44 at a planar member 58 which has a generally trapezoidal outline. The structural offsets 54 of the end portions 44 and the offset structure 46 of the top portion provide for a generally quite rigid top cover. The features as described above are generally in conformance with the prior art wafer carrier depicted in FIGS. 3, 4, and 5. The distinction and principal improvement is the latching mechanism 62 shown in cross-section in FIG. 12 and 12A. The latching mechanism has a first latching member 64 connecting to the end portion 44 by way of a living hinge 65. The first latching member is comprised of a protruding hook portion 68 and an extension portion 70. The protruding hook portion 68 has a first engagement portion 72 with a engagement surface 74 and a lead-in surface 75. The extension portion is generally of the same thickness and generally a planar member as the trapezoidal planar member 58.

The cooperating second latching member 66 is integral with the cassette 20 and is best shown in FIGS. 7, 8, 12, and 12A. The cooperating second latching member 66 has a second engagement portion 78 with a second engagement surface 80. The second latching member 66 operates as and is configured as a catch and is integral with the rim 50 and the planar portion 41 of the cassette endwalls.

The living hinge 65 is formed by a linear thinned portion 84 formed by a linear groove 86 extending horizontally across the substantially planar portion 87 of the top cover end portion 44. The living hinge articulates the end portion between the upper section 88 of the top cover and the lower section 89.

This embodiment as shown in FIGS. 6, 7, 8, 9, 10, 11, 12, and 12A generally operates as follows. With the cassette unloaded the top cover is simply lowered down onto the cassette with the offset portions 54 and the U-shaped flange 57 telescoping into the U-shaped recess 36. The first latching member 64 will either be in a relaxed outwardly extending position somewhat beyond that as shown in FIG. 12A or will naturally flex out due to the engagement of the angled surface 75 with the corner 79 of the rim 50 of the cassette. Due to the relatively high level of flexibility provided at the living hinge 65 the first latching member will flex outwardly with practically no resistance. When the top cover is fully telescoped in such as shown in FIG. 12A the first latching member 64 may be manually or robotically pushed inwardly whereby the first engagement portion 72 and the associated engagement surface 74 contacts the second engagement portion 78 and associated engagement surface 80 the surfaces are appropriately shaped such that the extension portion 70 is put under tension as the first latching member moves from the position shown FIG. 12A to the fully latched and engaged position as shown in FIG. 12. Note that the extension portion may have stiffening ribs or structures as indicated by the dashed lines of FIGS. 6 and 12A labelled with the numeral 85 to minimize flexing of said extension portion. Typically the extension portion 70 will remain in lesser tension than when it is in said fully latched position as compared to when it slides over the bump or projection 83. This position also will provide a force urging engagement and sealing of the U-shaped flange 57 of the end portion with the rim 50.

Note that each respective end portion 44 of the top cover is shown ideally with two engagement portions configured as the protruding hook portion 68. Although, appropriately one or more than two would also be contemplated for each end portion 44 and be considered within the scope of the invention. When the top cover 22 is placed onto a fully loaded cassette 20, typically an additional downward pressure will be necessary on the top portion 42 of the top cover 22 to flex the cushions 48 which engage the disk 35 to allow the first latching member 64 to be in a position to engage and close on the cooperating second latching member 66. In this embodiment the bottom cover operates and may be configured as in the prior art or in other suitable configurations.

Referring next to FIGS. 13, 14, 15 and 16, this particular embodiment utilizes a second latching member 90 configured as a tab portion 91 integral with and extending from the bottom cover 24 by way of a living hinge 92. Each second cooperating latching member 90 is comprised of second engagement portions 96, 98 which are configured as nubs extending from a generally planar extension portion 94. The end portions 44 of the top cover 22 have a first engagement member 102 positioned below the recess portion 103 of the end portions 44 with a pair of recesses 104 configured to receive and engage the nubs 96, 98. The nubs and recesses are preferably sized such that a friction engagement maintains the extension member in slight tension to secure the package together.

Figure 14:
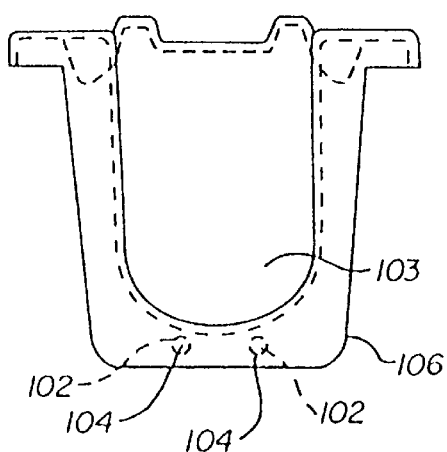
FIG. 14 is an elevational end view of the end portion of a top cover of the carrier of FIG. 13.
Figure 14A:
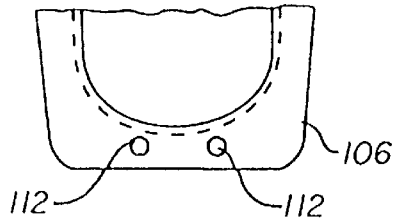
FIG. 14A is an end view of an end portion in an alternate embodiment of the invention.
Figure 16A:
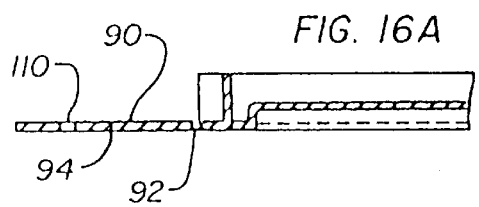
FIG. 16A is a cross-sectional view of a bottom cover in an alternate embodiment of the invention.
Figure 14B:
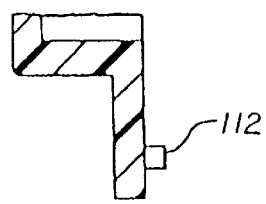
FIG. 14B is a cross-sectional view taken at line 14B—14B of FIG. 14A.

A slight variation of the embodiment of FIGS. 13, 14, 15, and 16 is shown in FIGS. 14A, 14B, and 16A. In this embodiment the nubs on the second engagement member 90 are replaced by apertures 110 and the recesses in the lower portion 106 of the end portion 44 of the top cover 22 are replaced by projecting members configured as nubs 112. In both these embodiments (FIGS. 13, 14, 15, and 16, and FIGS. 14A, 14B, and 16A) the bottom cover is first placed on the cassette and then the top cover is lowered into position and the extension members 94 are swung or folded up to an upright position and secured with the cooperating engagement portion on the end portion of the top cover.

Referring to FIGS. 17, 18, 19, 20, and 20A an additional embodiment of the invention is shown. The end portions 44 of the top cover 22 utilize an extension portion configured as a tab portion 116 extending downwardly from and articulated with respect to the balance of the end portion at a living hinge 120. The tab portion at the apertures constitute the first engagement member and cooperate with the second engagement member configured as nubs 128 extending from and integral with the bottom cover 24. This embodiment operates by way of the bottom cover first being placed on the cassette and the top cover being lowered down and put into proper closing position at which point the extension portions 116 are swung downwardly and the recesses 124 are engaged with the nubs 128 on said bottom cover. The nubs may be appropriately shaped as shown in FIG. 20a to provide a lead-in wedge surface 132 to allow easy engagement and a slight recess surface 134 to retain the tabbed portion in place on the nub. As in the previous embodiment a slight variation is available in which the nubs may be positioned on the extension portion 116 with suitable cooperating apertures placed in the bottom cover 24 to secure the top cover end position. An additional slight modification would allow the nub 128 to be positioned on the planar portion 41 of the endwall of the cassette. In this embodiment the bottom cover would be held onto the cassette exclusively by way of the conventional friction engagement.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A container assembly for holding memory disks in axial alignment, the container comprising:

a) a generally box-shaped cassette with two sidewalls adjoining two endwalls, the cassette having an open top, an open bottom, a pair of side walls each side wall with inwardly facing teeth defining slots for receiving memory disks, each endwall having a top edge, a bottom edge, and a centrally positioned recess extending downwardly from the top edge toward the bottom edge;

b) a top cover removably engageable with the cassette to close the open top, the top cover having a generally rectangular top portion and two opposite end portions integral with the top portion, the end portions extending downwardly and substantially normally from said top portion, each end portion having a recess closing portion for closing each of said recesses;

c) a bottom cover for closing the open bottom; and d) a pair of latching mechanisms for securing the top cover to the cassette, each latching mechanism comprised of a first latching member and a cooperating second latching member, each of said first latching members extending from one of said end portions and having a living hinge positioned below the recess closing portion of each end portion connecting said latching member to said end portion and further having a first engagement portion, each cooperating second latching member positioned on one of the cassette and the bottom cover below the respective recess on each endwall, the cooperating second latching member having a second engagement portion to engage the first latching member.

2. The container of claim 1, wherein each recess on each endwall is defined by a U-shaped rim and wherein each recess closing portion further comprises an offset portion configured to extend into said recess and to follow along said rim when the top cover is in place on said cassette.

3. The container of claim 2, wherein each first latching member has an elongate cross-section and each living hinge is comprised of a thinned portion extending laterally along said first latching member.

4. The container of claim 2, wherein each of the first latching members comprise an extension portion and wherein when the first latching members are latched to the cooperating second latching members said first and second latching members are positioned to put each extension member under tension.

5. The container of claim 4, wherein each first latching member further comprises a hook portion to cooperatively engage the respective second latching mechanism and wherein each second latching member is positioned on the endwall of the cassette.

6. The container of claim 4, wherein each first latching member further comprises a projection extending inwardly, and the second latching member is on the bottom cover and is configured to receive and retain said projection.

7. The container of claim 4, wherein each first latching member has an opening and wherein the second latching member comprises a projection for engaging and securing said first latching member at said opening.

8. The container of claim 7, wherein each said second latching member is integral with the cassette.

9. The container of claim 7, wherein each said second latching member is integral with the bottom cover.

10. The container of claim 1, wherein each of the first latching members comprise an extension portion and a hook portion and each of the second latching members comprise a hook receiving portion.

11. The container of claim 10, wherein each living hinge comprises a groove extending horizontally across the extension portion.

12. The container of claim 5, wherein the top cover is latched to the cassette by pushing the first latch members toward the cassette whereby said hook portions engage the second latch members thereby putting the extension portion under tensions.

13. The container of claim 1, wherein each recess on each endwall is defined by a U-shaped rim portion and each top cover end portion has a flange configured to said rim portion whereby when the top cover is latched to the cassette the flange is urged toward said U-shaped rim.

14. A container for holding a plurality of memory disks in axial alignment, the container comprising:
   a) a generally box shaped cassette with two sidewalls adjoining two endwalls, the cassette having an open top, an open bottom, a pair of side walls each side wall with inwardly facing teeth defining slots for receiving memory disks, a pair of endwalls, each endwall having a top edge and a bottom edge, each endwall having a centrally positioned recess extending downwardly from the top edge toward the bottom edge;
   b) a bottom cover for closing the open bottom; and
   c) a top cover removably engageable with the cassette to close the open top, the top cover having a generally rectangular top portion and two opposite articulated end portions, the end portions shaped to close the open recesses in the endwalls, the end portions integral with the top portion and having an upper section and a lower section with the end portions articulated intermediate said upper section and said lower section, each of said lower sections latchable to one of the cassette and the bottom cover under tension thereby securing said top cover on said cassette.

15. The container of claim 14, wherein the lower section of each end piece is latchable to said cassette and wherein the cassette comprises a protruding member on each endwall integral with said cassette, the bottom portion latchable to said cassette by engaging said protruding member.

16. The container of claim 15, wherein each of the lower sections have a surface with an opening facing the cassette, the opening sized to extend over and engage the respective protruding member when the top cover is in place.

17. The container of claim 16, wherein each protruding member is a nub and wherein the opening in the surface of each lower section is part of a hole extending through said lower section.

18. The container of claim 14, wherein the lower section of each end piece is latchable to the bottom cover, and wherein the bottom cover has a pair of opposite engagement portions, each engagement portion configured to receive one of said lower sections under tension.

19. The container of claim 14, wherein when the top cover is in place on the cassette, the upper section of each end piece covers the respective recess and wherein the lower section of each end piece is positioned below said recess.

20. The container of claim 19 wherein each recess on each endwall is defined by a U-shaped rim, and wherein each upper section further comprises an offset portion configured to extend into said recess and to follow along said rim when the top cover is in place on said cassette.

21. A container for holding disks in axial alignment, the container comprising:
   a) a generally box-shaped cassette with two sidewalls adjoining two endwalls, the cassette having an open top, an open bottom, a pair of sidewalls each sidewall with inwardly facing teeth defining slots for receiving disks, at least one endwall having a top edge, a bottom edge, and centrally positioned recess extending downwardly from the top edge toward the bottom edge,
   b) a top cover removably engageable with the cassette to close the open top, the top cover having a generally rectangular top portion and an end portion integral with the top portion, the end portion extending downwardly and substantially normally from said top portion, the end portion having an upper section with a recess closing portion for closing said recess, the end portion further having a lower section joined to the upper section by a thinned section extending horizontally across each end portion whereby the lower section is moveable inwardly and outwardly flexing principally at said thinned section; and
   c) a latching member for securing the top cover, the latching member positioned on the lower section.

* * * * *

UNITED STATES PATENT AND TRADEMARK OFFICE
CERTIFICATE OF CORRECTION

PATENT NO. : 6,070,730 Page 1 of 1
DATED : June 6, 2000
INVENTOR(S) : Motoyuki Narisawa, Kazuo Kaneko, Timothy D. Schmidt, Dale A. Maenke and Michael C. Zabka It is certified that error appears in the above-identified patent and that said Letters Patent is hereby corrected as shown below:

Column 1,
Line 35, delete "to".
Line 50, "placed" should be -- place --.
Line 57, "scrapping" should be -- scrapping --.

Column 3,
Line 12, delete "a".
Line 64, "cassettes" should be -- cassette --.

Column 4,
Line 38, "a" should be -- an --.

Column 5,
Line 5, a period should be inserted after "80".
Line 8, -- in -- should be inserted after "shown".

Column 6,
Line 67, "comprise" should be -- comprises --.

Column 8,
Line 11, "have" should be -- has --.

Signed and Sealed this

Fifteenth Day of October, 2002

*Attest:*

JAMES E. ROGAN
*Attesting Officer*     *Director of the United States Patent and Trademark Office*